US012805165B2

(12) United States Patent
Park et al.

(10) Patent No.: US 12,805,165 B2
(45) Date of Patent: Nov. 17, 2026

(54) DISPLAY DEVICE INCLUDING SCATTERING LAYER COMPRISING LIQUID CRYSTAL MOLECULES AND REACTIVE MESOGEN

(71) Applicant: Samsung Display Co., LTD., Yongin-si (KR)

(72) Inventors: Gilyeong Park, Yongin-si (KR); Heeyoung Lee, Yongin-si (KR); Dasom Gu, Yongin-si (KR); Sungguk An, Yongin-si (KR); Soyeon Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 348 days.

(21) Appl. No.: 18/443,610

(22) Filed: Feb. 16, 2024

(65) Prior Publication Data

US 2024/0341158 A1 Oct. 10, 2024

(30) Foreign Application Priority Data

Apr. 5, 2023 (KR) ........................ 10-2023-0044931

(51) Int. Cl.

| | |
|---|---|
| ***H10K 59/80*** | (2023.01) |
| ***H10K 59/122*** | (2023.01) |
| ***H10K 59/38*** | (2023.01) |
| ***H10K 59/50*** | (2023.01) |
| ***H10K 71/12*** | (2023.01) |
| ***H10K 71/40*** | (2023.01) |
| *H10K 102/00* | (2023.01) |

(52) U.S. Cl.

CPC ......... *H10K 59/877* (2023.02); *H10K 59/122* (2023.02); *H10K 59/38* (2023.02); *H10K 59/50* (2023.02); *H10K 71/125* (2023.02); *H10K 71/421* (2023.02); *H10K 2102/311* (2023.02)

(58) Field of Classification Search

CPC .. H10K 59/1201; H10K 59/122; H10K 59/38; H10K 59/50; H10K 59/877; H10K 59/8791; H10K 59/8792; H10K 71/125; H10K 71/421; H10K 2102/311; G02F 1/133726; C09J 2301/302

See application file for complete search history.

(56) References Cited

U.S. PATENT DOCUMENTS

| | | | | |
|---|---|---|---|---|
| 7,081,215 B2 | | 7/2006 | Natarajan et al. | |
| 2018/0149872 A1* | | 5/2018 | Choi | G02B 27/017 |
| 2021/0104622 A1* | | 4/2021 | Park | H10D 30/015 |
| 2021/0141417 A1* | | 5/2021 | Seo | G06F 3/0446 |
| 2022/0052118 A1* | | 2/2022 | Kim | H10K 59/38 |
| 2024/0243485 A1* | | 7/2024 | Suzuki | G02F 1/1337 |

* cited by examiner

*Primary Examiner* — Nelson Garces

(74) *Attorney, Agent, or Firm* — CANTOR COLBURN LLP

(57) ABSTRACT

A display device includes a display panel including a pixel-defining film in which a plurality of pixel openings is defined, and a light-emitting layer disposed in each of the plurality of pixel openings, an optical layer disposed on the display panel and including at least one of a dye or a pigment, and a scattering layer disposed on the optical layer. Since the scattering layer includes a polymer resin and a plurality of droplets dispersed in the polymer resin, and the plurality of droplets each includes a plurality of liquid crystal molecules and a reactive mesogen for fixing the plurality of liquid crystal molecules.

15 Claims, 11 Drawing Sheets

FIG. 4A

DISPLAY DEVICE INCLUDING SCATTERING LAYER COMPRISING LIQUID CRYSTAL MOLECULES AND REACTIVE MESOGEN

This application claims priority to Korean Patent Application No. 10-2023-0044931, filed on Apr. 5, 2023, and all the benefits accruing therefrom under 35 U.S.C. § 119, the content of which in its entirety is herein incorporated by reference.

BACKGROUND

1. Field

The disclosure herein relates to a display device and a method of manufacturing the same, and more particularly, to a display device including a scattering layer which reduces external light reflection.

2. Description of the Related Art

Various display devices used for multimedia devices such as a television, a mobile phone, a tablet computer, and a game console are being developed. A display device may be a rigid-type display device or a flexible-type display device which is deformable, e.g., foldable, rollable, or bendable, into various shapes.

Optical members for improving display quality are being used in various types of display devices. In development of optical members, it is desired for the optical members to have excellent optical characteristics and relatively low reflectivity.

SUMMARY

The disclosure provides a display device which exhibits reduced external light reflection characteristics and also has excellent folding reliability and durability.

Also, the disclosure provides a method of manufacturing a display device with reduced external light reflection.

An embodiment of the inventive concept provides a display device including: a display panel including a pixel-defining film in which a plurality of pixel openings is defined, and a light-emitting layer disposed in each of the plurality of pixel openings; an optical layer disposed on the display panel and including at least one of a dye or a pigment; and a scattering layer disposed on the optical layer, wherein the scattering layer includes a polymer resin and a plurality of droplets dispersed in the polymer resin, and the plurality of droplets each includes a plurality of liquid crystal molecules, and a reactive mesogen which fixes the plurality of liquid crystal molecules.

In an embodiment, alignment directions of the plurality of liquid crystal molecules may be fixed in the same direction.

In an embodiment, light incident onto the optical layer may be non-polarized light.

In an embodiment, a transmittance of the scattering layer with respect to visible light may be about 50% to about 100%, and the scattering layer may have a haze of about 1% to about 50%.

In an embodiment, the scattering layer may have a thickness of about 1 micrometer (μm) to about 100 μm.

In an embodiment, the scattering layer may further include an ultraviolet absorbing material or an infrared absorbing material.

In an embodiment, the scattering layer may include: an adhesive layer disposed on the optical layer; and a scattering film disposed on the adhesive layer, wherein the scattering film may include the polymer resin and the plurality of droplets.

In an embodiment, the adhesive layer may include a pressure sensitive adhesive ("PSA").

In an embodiment, the optical layer may include a color filter layer including division patterns in which division openings are defined respectively corresponding to the plurality of pixel openings, and a filter portion disposed to overlap each of the division openings.

In an embodiment, the optical layer further may include an overcoat layer disposed on the color filter layer.

In an embodiment, the display panel may further include an inorganic deposition layer disposed on the light-emitting layer, and the optical layer may include a light control layer including the pigment or the dye.

In an embodiment, the light-emitting layer may not include liquid crystal molecules.

In an embodiment, the display device may include: a folding region; and a first non-folding region and a second non-folding region which are spaced apart from each other with the folding region therebetween in a first direction.

In an embodiment, the display device may further include a window disposed on the scattering layer.

In an embodiment of the inventive concept, a display device includes: a display panel including a pixel-defining film in which a plurality of pixel openings is defined, and a light-emitting layer disposed in each of the plurality of pixel openings; a color filter layer including division patterns, which are disposed on the display panel and in which division openings are defined respectively corresponding to the plurality of pixel openings, and a filter portion disposed to overlap each of the division openings; and a scattering layer disposed on the color filter layer, wherein the scattering layer includes a polymer resin and liquid crystal molecules which are dispersed in the polymer resin and of which alignment directions are fixed to a predetermined direction.

In an embodiment of the inventive concept, a method of manufacturing a display device includes: providing a preliminary display module including a display panel and an optical layer disposed on the display panel; and forming, on the preliminary display module, a scattering layer including a polymer resin, a plurality of droplets dispersed in the polymer resin, and a reactive mesogen, wherein the forming the scattering layer includes forming a preliminary scattering layer by dispersing, in a polymer resin, a plurality of preliminary droplets including liquid crystal molecules, aligning alignment directions of the liquid crystal molecules with the predetermined direction, and forming the plurality of droplets by polymerizing the reactive mesogen and fixing the alignment directions of the liquid crystal molecules.

In an embodiment, the forming the preliminary scattering layer may include phase-separating the liquid crystal molecules and the polymer resin.

In an embodiment, the forming the preliminary scattering layer may include forming the plurality of preliminary droplets by forming an emulsion of the liquid crystal molecules.

In an embodiment, the aligning the alignment directions of the liquid crystal molecules with the predetermined direction may include applying a voltage of a predetermined level or more to the preliminary scattering layer.

In an embodiment, the forming the plurality of droplets may include photopolymerizing the reactive mesogen by irradiating the preliminary scattering layer with ultraviolet rays.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
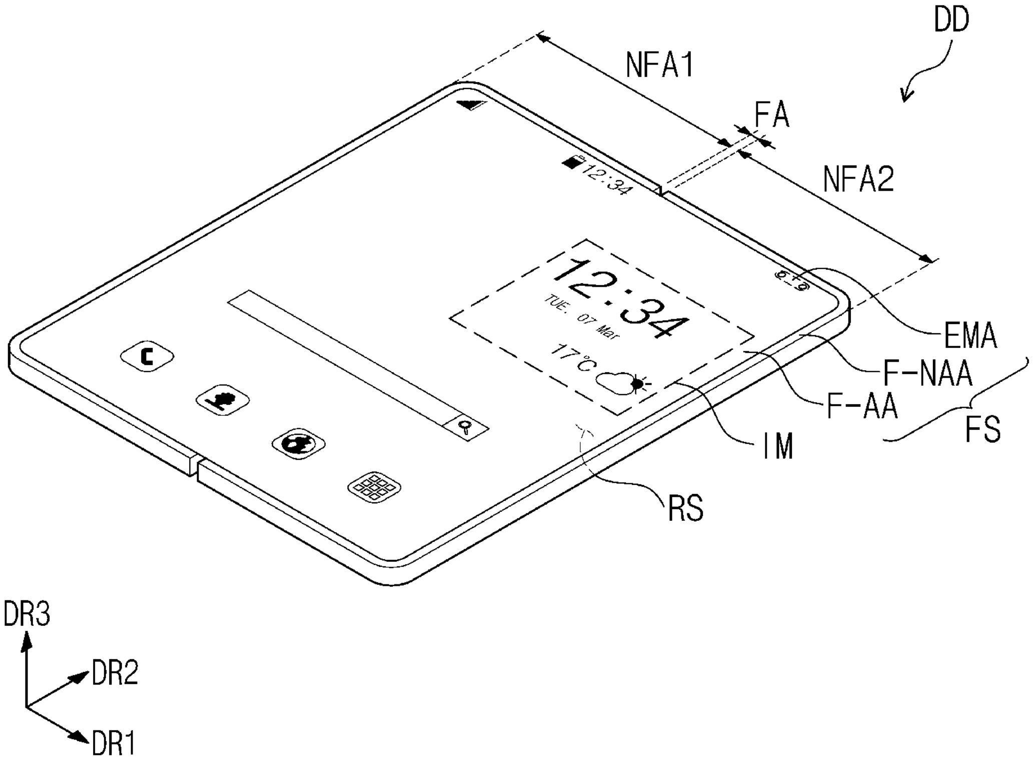
FIG. 1A is a perspective view illustrating an embodiment of an unfolded state of a display device.

The inventive concept may be implemented in various modifications and have various forms, and illustrative embodiments are illustrated in the drawings and described in detail in the text. It is to be understood, however, that the inventive concept is not intended to be limited to the particular forms disclosed, but on the contrary, is intended to cover all modifications, equivalents, and alternatives falling within the spirit and scope of the inventive concept.

In this specification, it will be understood that when an element (or region, layer, portion, or the like) is referred to as being "on", "connected to" or "coupled to" another element, it may be directly disposed/connected/coupled to another element, or intervening elements may be disposed therebetween.

In this specification, it will be understood that "being directly disposed" means that there are no intervening layers, films, regions, plates or the like between a portion of layers, films, regions, plates or the like and another portion. For example, "being directly disposed" may mean to be disposed between two layers or two members without using an additional member such as an adhesive member or like.

Like reference numerals or symbols refer to like elements throughout. In the drawings, the thickness, the ratio, and the dimension of the elements are exaggerated for effective description of the technical contents. The term "and/or" includes all combinations of one or more of the associated listed elements.

Although the terms first, second, etc., may be used to describe various elements, these elements should not be limited by these terms. These terms are only used to distinguish one element from another element. For example, a first element may be referred to as a second element, and similarly, a second element may also be referred to as a first element without departing from the scope of the inventive concept. The singular forms include the plural forms as well, unless the context clearly indicates otherwise.

Also, the terms such as "below", "lower", "above", "upper" or the like, may be used for the description to describe one element's relationship to another element illustrated in the drawing figures. It will be understood that the terms have a relative concept and are described on the basis of the orientation depicted in the drawing figures. In this specification, "being disposed on" may mean to be disposed not only on an upper part but also on a lower part of one member.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, ±20%, ±10%, ±5% of the stated value, for example.

Unless otherwise defined, all terms (including technical and scientific terms) used herein have the same meaning as commonly understood by one of ordinary skill in the art to which the disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

It will be understood that the term "includes" or "comprises", when used in this specification, specifies the presence of stated features, integers, steps, operations, elements, components, or any combinations thereof, but does not preclude the presence or addition of one or more other features, integers, steps, operations, elements, components, or combinations thereof.

Hereinafter, a display device in an embodiment of the inventive concept will be described with reference to the accompanying drawings.

Figure 1B:
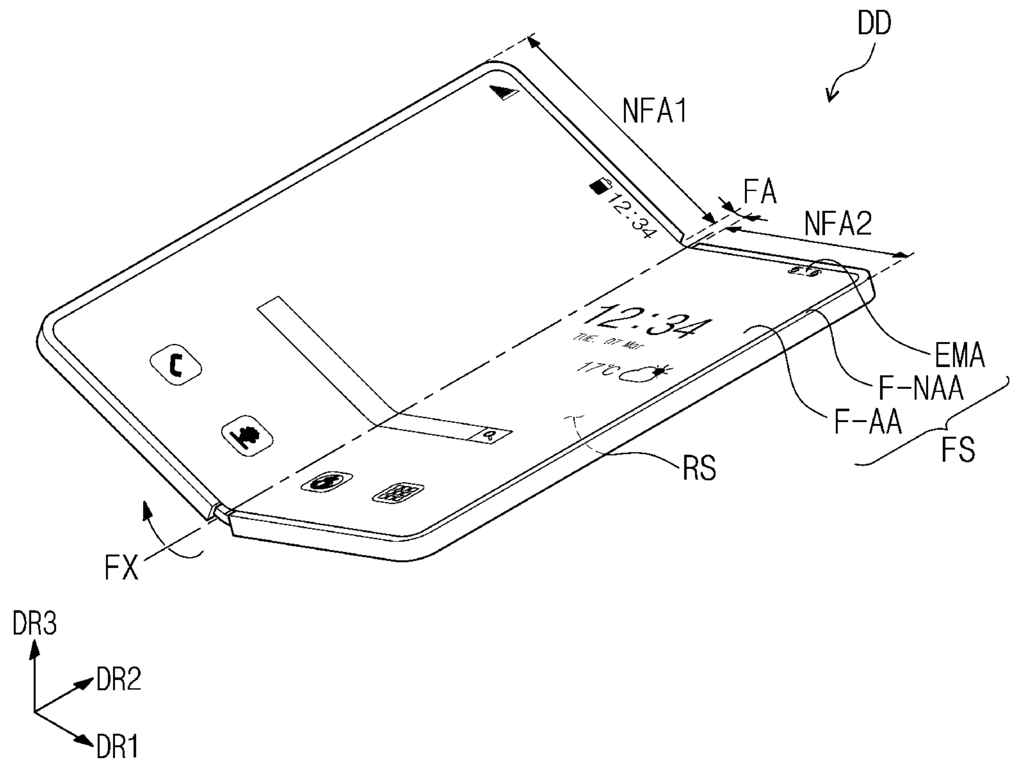
FIG. 1B is a perspective view illustrating an embodiment of a folding operation of a display device.
Figure 1C:
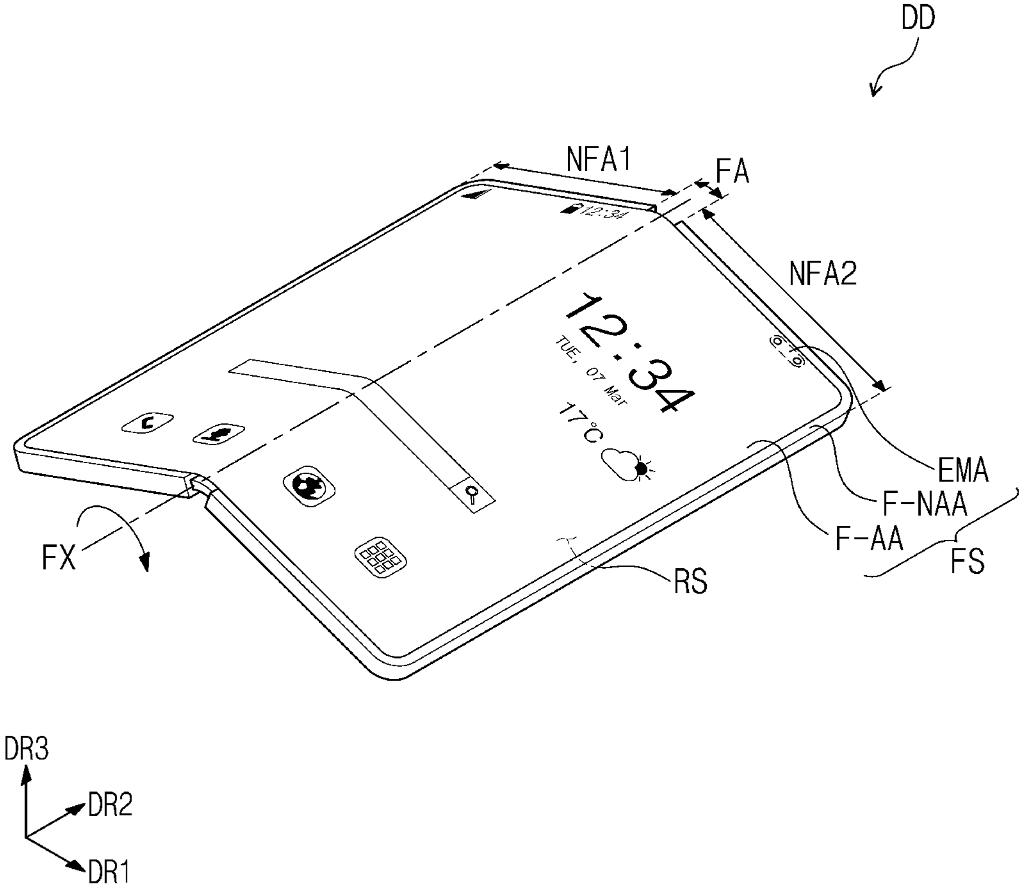
FIG. 1C is a perspective view illustrating an embodiment of a folding operation of a display device.

FIG. 1A is a perspective view illustrating an embodiment of an unfolded state of a display device. FIG. 1B is a perspective view illustrating that the display device illustrated in FIG. 1A is being in-folded. FIG. 1C is a perspective view illustrating that the display device illustrated in FIG. 1A is being out-folded.

A display device DD in an embodiment may be a device activated in response to an electrical signal. In an embodiment, the display device DD may be a mobile phone, a tablet computer, a car navigation system, a game console, or a wearable device, for example, but the inventive concept is not limited thereto. In FIG. 1A, etc., of the specification, the display device DD is illustrated as a mobile phone.

Referring to FIGS. 1A to 1C, the display device DD in an embodiment may include a first display surface FS defined by a first direction axis DR1 and a second direction axis DR2 crossing the first direction axis DR1. The display device DD may provide an image IM to users through the first display surface FS. The display device DD in an embodiment may display, in a third direction axis DR3, the image IM on the first display surface FS parallel to each of the first direction axis DR1 and the second direction axis DR2. In this specification, a front surface (or upper surface) and a rear surface (or lower surface) of each component are defined based on a direction in which the image IM is displayed. The front surface and the rear surface may be opposed to each other in the third direction axis DR3, and a normal direction of each of the front surface and the rear surface may be parallel to the third direction axis DR3.

The display device DD in an embodiment may detect an external input applied from the outside. The external input may include various types of inputs provided from the outside of the display device DD. In an embodiment, the external input may include not only a touch by a part of a user's body such as a user's hand but also an external input (e.g., hovering) applied while approaching or being adjacent within a predetermined distance to the display device DD, for example. In addition, the external input may have various forms such as force, pressure, temperature, light, or the like.

In FIG. 1A and the following drawings, the first to third direction axes DR1, DR2, and DR3 are illustrated, and the directions indicated by the first to third direction axes DR1, DR2, and DR3 illustrated herein have a relative concept and may thus be changed to other directions. In addition, the directions indicated by the first to third direction axes DR1, DR2, and DR3 may be also referred to as first to third directions, and may thus be denoted as the same reference numerals or symbols.

The display device DD in an embodiment may include the first display surface FS and a second display surface RS. The first display surface FS may include an active region F-AA, a peripheral region F-NAA, and an electronic module region EMA. In an embodiment, the electronic module region EMA may be included in the active region F-AA. The second display surface RS may be defined as a surface opposed to at least a portion of the first display surface FS. That is, the second display surface RS may be defined as a portion of the rear surface of the display device DD.

The active region F-AA of the display device DD may be a region activated in response to an electrical signal. The display device DD in an embodiment may display the image IM through the active region F-AA. Also, various types of external inputs may be detected in the active region F-AA.

The peripheral region F-NAA may be adjacent to the active region F-AA. The peripheral region F-NAA may have a predetermined color. The peripheral region F-NAA may surround the active region F-AA. Accordingly, a shape of the active region F-AA may be substantially defined by the peripheral region F-NAA. However, this is merely one of embodiments, and the peripheral region F-NAA may be disposed adjacent only to one side of the active region F-AA, or may be omitted. The display device DD in an embodiment of the inventive concept may include active regions having various shapes, but is not limited to any particular embodiment.

Various electronic modules may be disposed in the electronic module region EMA. In an embodiment, the electronic module may include at least one of a camera, a speaker, a light detection sensor, or a heat detection sensor, for example. The electronic module region EMA may detect an external subject received through the first and second display surfaces FS and RS, or provide a sound signal, such as a voice, to the outside through the first and second display surfaces FS and RS. The electronic module may also include a plurality of components, and is not limited to any particular embodiment.

FIG. 1A, etc., illustrate that the electronic module region EMA is disposed in the active region F-AA, but the inventive concept is not limited thereto. In an embodiment, the electronic module region EMA may be surrounded by the active region F-AA and the peripheral region F-NAA, or may be surrounded by the peripheral region F-NAA, for example.

The display device DD may include at least one folding region. The display device DD in an embodiment may include a folding region FA and non-folding regions NFA1 and NFA2. In an embodiment, the non-folding regions NFA1 and NFA2 may be disposed adjacent to the folding region FA with the folding region FA therebetween. The display device DD in an embodiment may include a first non-folding region NFA1 and a second non-folding region NFA2 which are spaced apart from each other in the first direction axis DR1 with the folding region FA therebetween. In an embodiment, the first non-folding region NFA1 may be disposed on one side of the folding region FA along the first direction axis (hereinafter also referred to as a first direction) DR1, and the second non-folding region NFA2 may be disposed on the other side of the folding region FA along the first direction DR1, for example.

In the display device DD in a folded state, the folding region FA may have a radius of curvature of about 1.5 millimeters (mm) or less. In an embodiment, in the display device DD having a structure in which the first non-folding region NFA1 and the second non-folding region NFA2 are folded so as to face each other, the folding region FA may have a radius of curvature of about 1.0 mm or less, for example.

FIGS. 1A to 1C illustrate embodiments of the display device DD including one folding region FA, but the inventive concept is not limited thereto. A plurality of folding regions may be defined in the display device DD. In an embodiment, a display device may include two or more folding regions and also include three or more non-folding regions disposed with respective folding regions therebetween, for example.

Referring to FIG. 1B, the display device DD in an embodiment may be folded with respect to a folding axis FX. The folding axis FX may be an imaginary axis extending in the second direction axis DR2 and be parallel to a long-side direction of the display device DD. On the first display surface FS, the folding axis FX may extend along the second direction axis DR2.

The display device DD may be folded with respect to the folding axis FX and changed into an in-folded state where in the first display surface FS, one region overlapping the first non-folding region NFA1 and the other region overlapping the second non-folding region NFA2 face each other.

The second display surface RS of the display device DD in an embodiment may be visible to users in an in-folded state. The second display surface RS may further include an electronic module region EMA in which an electronic module including various components is disposed, but is not limited to any particular embodiment.

Referring to FIG. 1C, the display device DD in an embodiment may be folded with respect to the folding axis FX and changed into an out-folded state where in the second display surface RS, one region overlapping the first non-folding region NFA1 and the other region overlapping the second non-folding region NFA2 face each other.

However, the inventive concept is not limited thereto, and the display device DD may be folded with respect to a plurality of folding axes such that respective portions of the first display surface FS and the second display surface RS face each other. The number of folding axes and the number of non-folding regions corresponding thereto are not particularly limited.

A shape of the display device in an embodiment is not limited to the embodiment illustrated in FIGS. 1A to 1C, etc., and the display device in an embodiment may be a foldable display device including a folding region which is folded with respect to a folding axis parallel to a short side of the display device. In an alternative embodiment, the display device in an embodiment may be a rigid-type display device which does not include a folding region.

Figure 2:
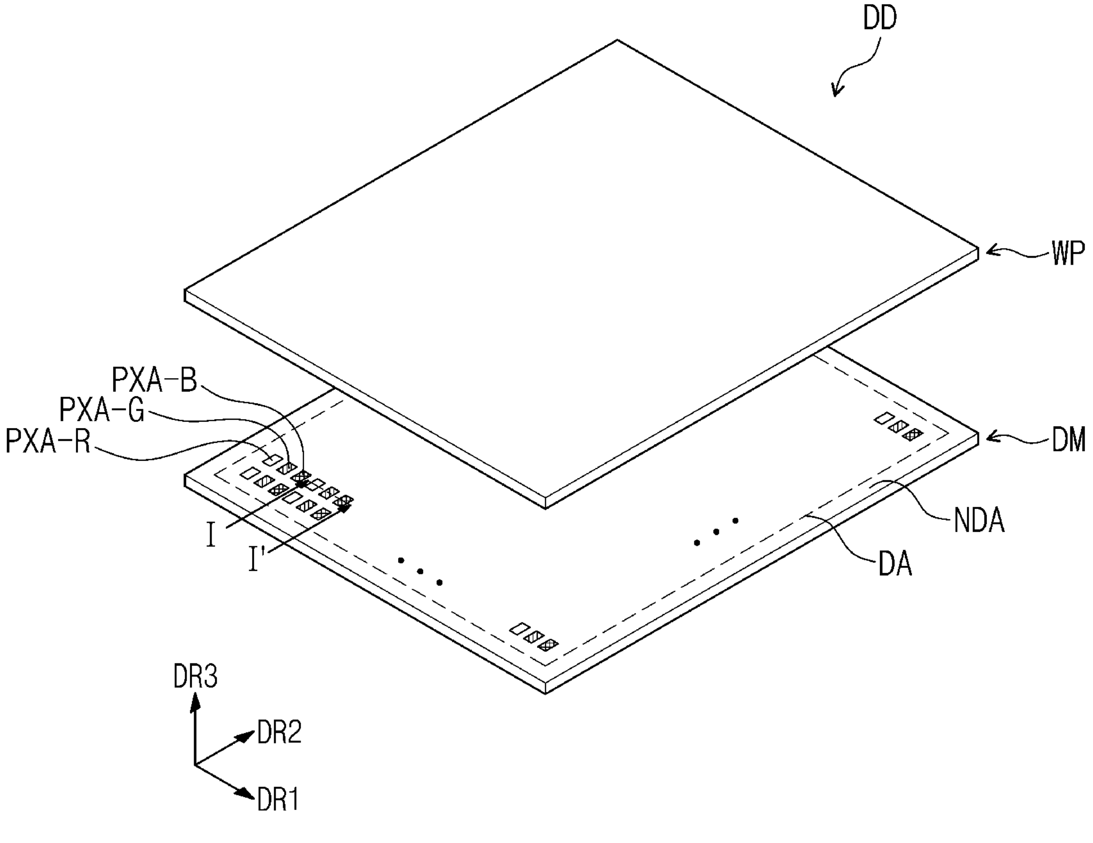
FIG. 2 is an exploded perspective view of an embodiment of a display device.

FIG. 2 is an exploded perspective view of an embodiment of a display device. A display device DD in an embodiment may include a display module DM and a window WP which are sequentially stacked in the third direction axis DR3. Also, although not illustrated, the display device DD may include an adhesive layer (not illustrated) disposed between the display module DM and the window WP.

The display module DM may display an image in response to an electrical signal and transmit/receive information about an external input. The display module DM may include a display region DA and a non-display region NDA. The display region DA may be defined as a region where an image provided from the display module DM is displayed.

The non-display region NDA is adjacent to the display region DA. In an embodiment, the non-display region NDA may surround the display region DA, for example. However, this is merely illustrated as an example. The non-display region NDA may be defined as various shapes, and is not limited to any particular embodiment. In an embodiment, the display region DA of the display module DM may correspond to at least a portion of the active region F-AA (refer to FIG. 1A).

The display module DM may include a plurality of pixels. The display region DA of the display module DM may include a plurality of pixel regions PXA-R, PXA-G, and PXA-B. The plurality of pixel regions PXA-R, PXA-G, and PXA-B may be repeatedly arranged throughout display region DA.

The display module DM may include a first pixel region PXA-R, a second pixel region PXA-G, and a third pixel region PXA-B which respectively emit light having different wavelength ranges. In an embodiment, the first pixel region PXA-R may be a red light-emitting region which emits red light, the second pixel region PXA-G may be a green light-emitting region which emits green light, and the third pixel region PXA-B may be a blue light-emitting region which emits blue light, for example. However, the inventive concept is not limited thereto, and a plurality of pixel regions may include a combination of pixel regions which emit light with other colors in addition to the above-described red, green, and blue. Also, the display module DM may include any one of pixel regions in plurality unlike other pixel regions, and may further include a white light-emitting region which emits white light in addition to the three pixel regions.

In a plan view, i.e., when viewed on a plane defined by the first direction axis DR1 and the second direction axis DR2, the first to third pixel regions PXA-R, PXA-G, and PXA-B may not overlap and be separated from each other. The display region DA of the display module DM may include a light-blocking region NPXA (refer to FIGS. 4A and 4B). The light-blocking region NPXA is disposed around the pixel regions PXA-R, PXA-G, and PXA-B, and sets boundaries of the pixel regions PXA-R, PXA-G, and PXA-B. The light-blocking region NPXA may surround each of the first to third pixel regions PXA-R, PXA-G, and PXA-B. In the light-blocking region NPXA, a structure for preventing color-mixing between the first to third pixel regions PXA-R, PXA-G, and PXA-B, e.g., a pixel-defining film PDL (refer to FIG. 4A), division patterns BM (refer to FIG. 4A), or the like may be disposed respectively corresponding thereto.

In the display device DD in an embodiment, the pixel regions PXA-R, PXA-G, and PXA-B may be arranged in a stripe form. Referring to FIG. 2, a plurality of first pixel regions PXA-R, a plurality of second pixel regions PXA-G, and a plurality of third pixel regions PXA-B may be arranged along the second direction axis (also referred to as a second direction) DR2. In addition, the pixel regions may be alternately arranged, along the first direction DR1, in order of the first pixel region PXA-R, the second pixel region PXA-G, and the third pixel region PXA-B.

FIG. 2, etc., illustrate that all the pixel regions PXA-R, PXA-G, and PXA-B have similar areas to each other, but the inventive concept is not limited thereto. The pixel regions PXA-R, PXA-G, and PXA-B may respectively have different areas according to a wavelength range of light emitted. The areas of the pixel regions PXA-R, PXA-G, and PXA-B may mean areas in a plan view, i.e., when viewed on a plane defined by the first direction DR1 and the second direction DR2.

An arrangement form of the pixel regions PXA-R, PXA-G, and PXA-B is not limited to the embodiment illustrated in FIG. 2, and an arrangement order of the red pixel region PXA-R, the green pixel region PXA-G, and the blue pixel region PXA-B may be provided in various combinations according to the characteristic of display quality desired for the display device DD. In an embodiment, the pixel regions PXA-R, PXA-G, and PXA-B may be arranged in a pentile matrix or a diamond pixel matrix, for example.

Also, the pixel regions PXA-R, PXA-G, and PXA-B may respectively have different areas. In an embodiment, in an embodiment, the area of the green pixel region PXA-G may be smaller than the area of the blue pixel region PXA-B, for example, but the inventive concept is not limited thereto.

The window WP may be disposed above the display module DM and cover the entirety of the upper surface of the display module DM. The window WP may have a shape corresponding to a shape of the display module DM. The window WP may be a substrate or a film which includes glass or a polymer material. In addition, the window WP may further include a functional layer, such as a protective film disposed above a base substrate or a film, an optical film layer, or the like.

Figure 3:
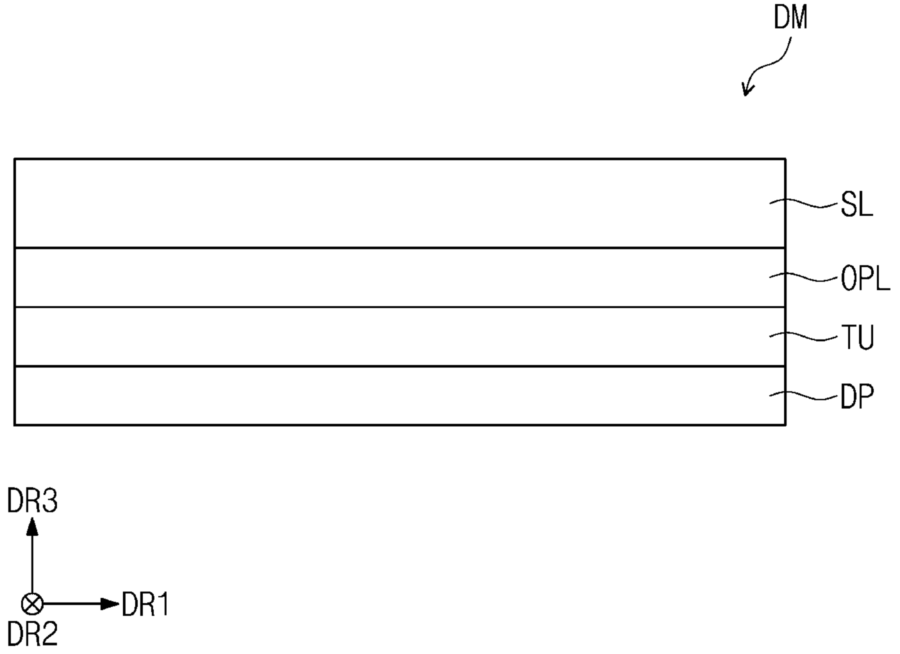
FIG. 3 is a cross-sectional view of an embodiment of a display module.
Figure 4A:
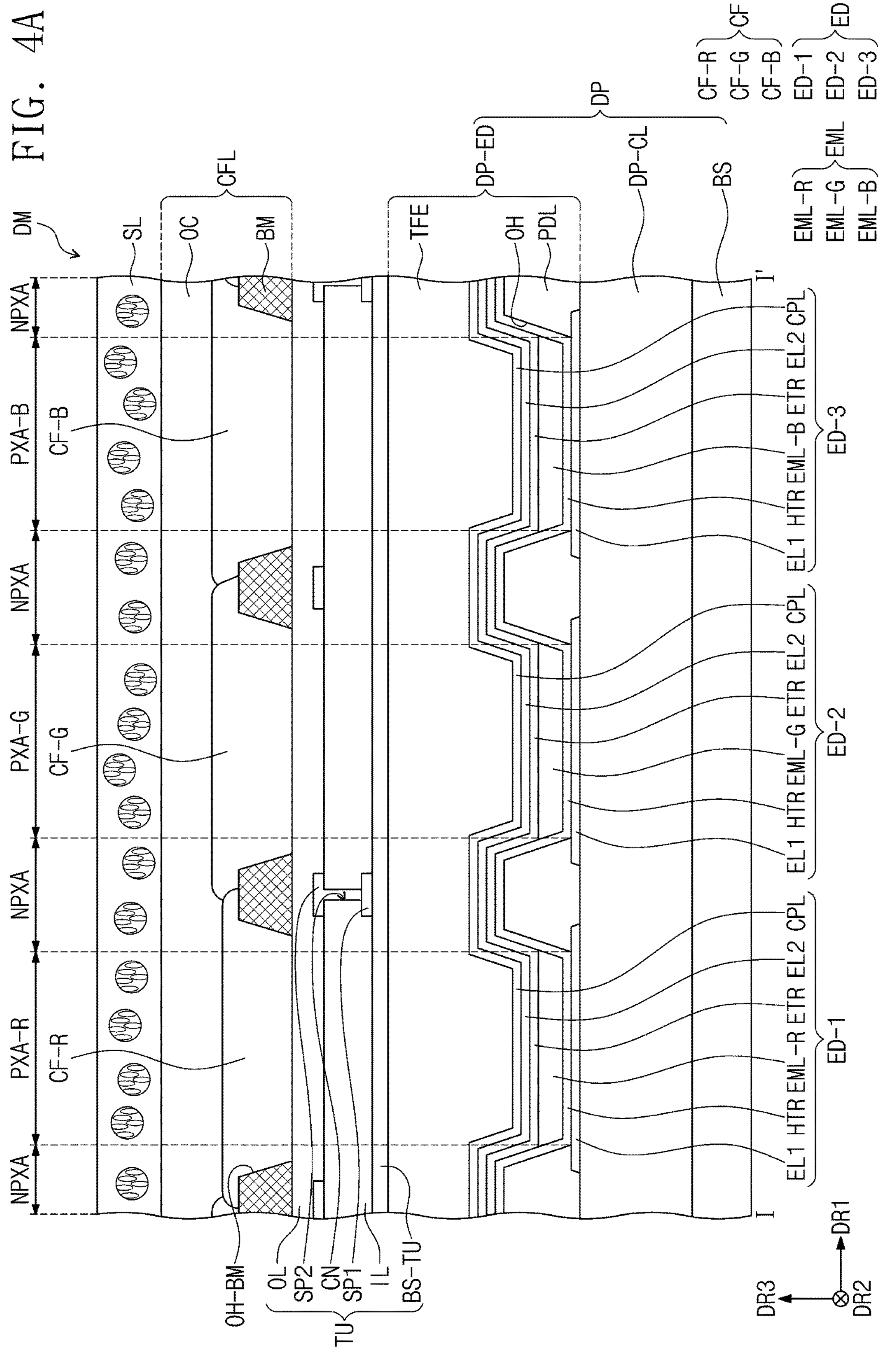
FIG. 4A is a cross-sectional view of an embodiment of a display module.
Figure 4B:
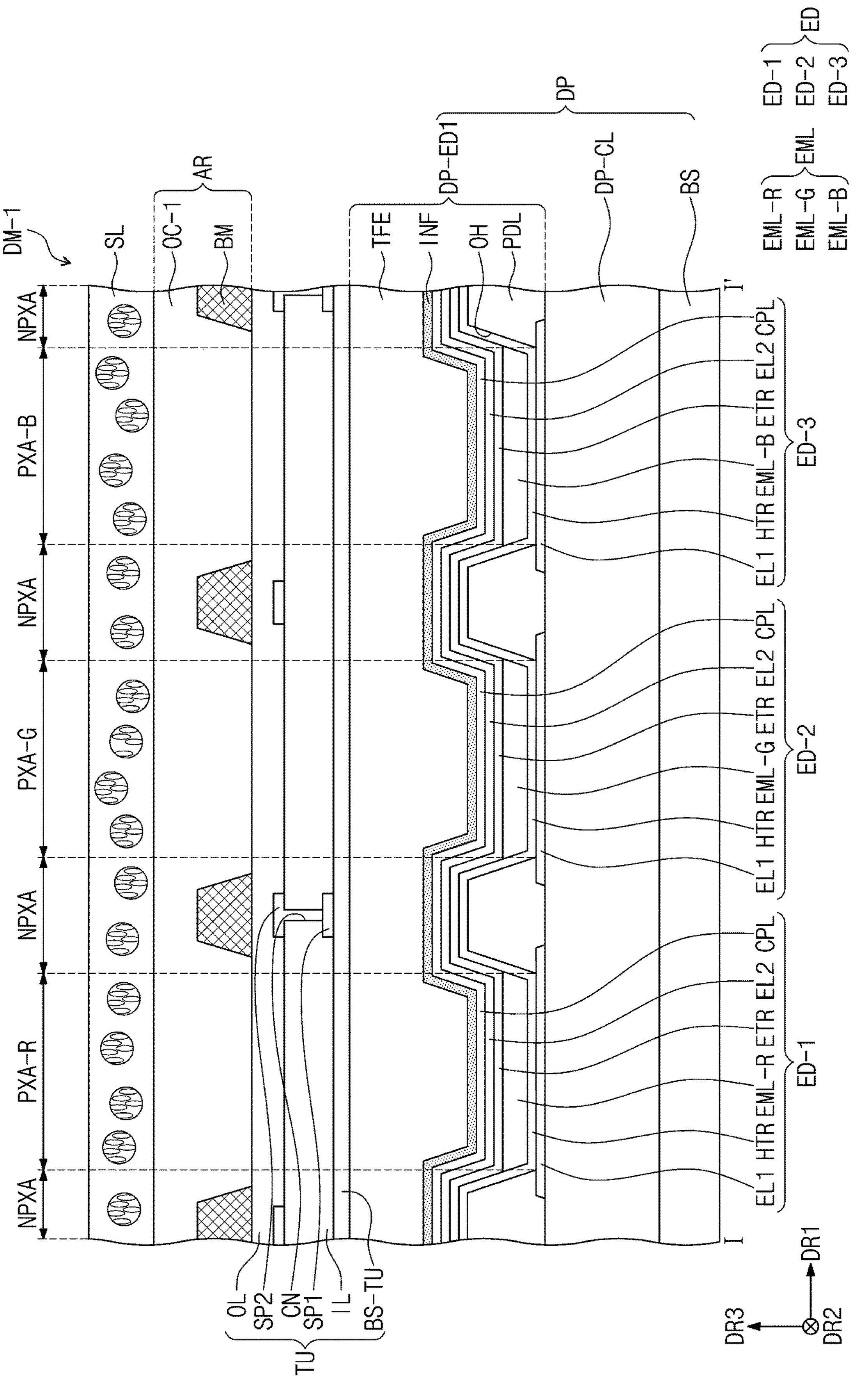
FIG. 4B is a cross-sectional view of an embodiment of a display module.

FIG. 3 is a cross-sectional view of an embodiment of a display module. FIGS. 4A and 4B are respectively cross-sectional views of display modules according to other embodiments. FIG. 3 briefly illustrates a stacked structure of a display module DM, and FIGS. 4A and 4B respectively illustrate cross sections of display modules DM and DM-1 taken along line I-I' of FIG. 2.

Referring to FIG. 3, the display module DM in an embodiment may include a display panel DP, a sensor layer TU disposed on the display panel, an optical layer OPL disposed on the sensor layer TU, and a scattering layer SL disposed on the optical layer OPL.

The optical layer OPL in an embodiment may include at least one of a dye or a pigment. The optical layer OPL may not include a polarizing plate. In the display module DM herein, in an embodiment, illustrated in FIG. 4A, the optical layer may mean a color filter layer CFL. In the display module DM-1, in an embodiment, illustrated in FIG. 4B, the optical layer may mean a light control layer AR.

Referring to FIG. 3 and FIG. 4A, the display module DM in an embodiment may include the display panel DP, the sensor layer TU disposed on the display panel DP, a color filter layer CFL disposed on the sensor layer TU, and the scattering layer SL disposed on the color filter layer CFL.

The display panel DP in an embodiment may be a light-emitting display panel. In an embodiment, the display panel DP may be a micro light-emitting diode ("LED") display panel, a nano LED display panel, an organic light-emitting display panel or a quantum dot light-emitting display panel, for example. However, this is merely one of embodiments, and any light-emitting display panel may be used without a limitation.

A light-emitting layer of an organic light-emitting display panel may include an organic light-emitting material. A light-emitting layer of a quantum dot light-emitting display panel may include quantum dots and/or quantum rods, etc. A micro LED display panel may include micro light-emitting diodes which are ultra-small light-emitting elements, and a nano LED display panel may include nano light-emitting diodes. Hereinafter, the display panel DP is illustrated as an organic light-emitting display panel.

The display panel DP may include a base layer BS, a circuit layer DP-CL, and a display element layer DP-ED which are sequentially stacked. The display element layer DP-ED may include a pixel-defining film PDL, a light-emitting element ED including a light-emitting layer EML disposed in each of a plurality of pixel openings OH defined in the pixel-defining film PDL, and an encapsulation layer TFE disposed on the light-emitting element ED.

In the display panel DP, the base layer BS may be a member that provides a base surface on which the display element layer DP-ED is disposed. The base layer BS may be rigid or flexible. The base layer BS may be a glass substrate, a metal substrate, a polymer substrate, or the like. However, the inventive concept is not limited thereto, and the base layer BS may be an inorganic layer, an organic layer, or a composite material layer.

The base layer BS may have not only a single-layered structure but also a multi-layered structure. In an embodiment, the base layer BS may have a three-layered structure of a polymer resin layer, an adhesive layer, and a polymer resin layer. Specifically, the polymer resin layer may include a polyimide-based resin, for example. In addition, the polymer resin layer may include at least one of an acylate-based resin, a vinyl-based resin, an epoxy-based resin, a urethane-based resin, a cellulose-based resin, a siloxane-based resin, or a perylene-based resin. In this specification, a "component-based" resin may be considered as including a functional group of the "component".

The circuit layer DP-CL may be disposed on the base layer BS. The circuit layer DP-CL may include an insulating layer, a semiconductor pattern, a conductive pattern, a signal line, or the like. The circuit layer DP-CL may include a plurality of transistors (not illustrated) formed by a semiconductor pattern, a conductive pattern, a signal line, or the like. The transistors (not illustrated) may each include a control electrode, an input electrode, and an output electrode. In an embodiment, the circuit layer DP-CL may include a switching transistor and a driving transistor for driving the light-emitting element ED, for example.

The display element layer DP-ED may be disposed on the circuit layer DP-CL. The display element layer DP-ED may include a pixel-defining film PDL, a light-emitting element ED, and an encapsulation layer TFE. In an embodiment, the display element layer DP-ED may include a plurality of light-emitting elements ED-1, ED-2, and ED-3.

The light-emitting elements ED-1, ED-2, and ED-3 each include a first electrode EL1, a second electrode EL2 facing the first electrode EL1, and a light-emitting layer EML disposed between the first electrode EL1 and the second electrode EL2. Also, the light-emitting elements ED-1, ED-2, and ED-3 may each further include a hole transport region HTR and an electron transport region ETR. In addition, the light-emitting elements ED-1, ED-2, and ED-3 may each include a capping layer CPL disposed on the second electrode EL2.

In the display element layer DP-ED, a first light-emitting element ED-1 may include a first light-emitting layer EML-R overlapping a first pixel region PXA-R, and a second light-emitting element ED-2 may include a second light-emitting layer EML-G overlapping a second pixel region PXA-G. A third light-emitting element ED-3 may include a third light-emitting layer EML-B overlapping a third pixel region PXA-B.

The pixel-defining film PDL may be disposed on the circuit layer DP-CL. The pixel-defining film PDL may have a plurality of pixel openings OH defined therein. At least a portion of the first electrode EL1 may be exposed in the pixel openings OH of the pixel-defining film PDL.

The pixel openings OH defined in the pixel-defining film PDL may respectively correspond to the pixel regions PXA-R, PXA-B, and PXA-G. The light-blocking region NPXA may be a region which is between the adjacent pixel regions PXA-R, PXA-B, and PXA-G and corresponds to the pixel-defining film PDL.

The pixel-defining film PDL may include an organic resin or an inorganic material. In an embodiment, the pixel-defining film PDL may include or consist of a polyacrylate-based resin, a polyimide-based resin, silicon nitride ($SiN_x$), silicon oxide ($SiO_x$), silicon nitride ($SiO_xN_y$), or the like, for example.

Also, in an embodiment, the pixel-defining film PDL may have a light-absorbing property. In an embodiment, the pixel-defining film PDL may have black color, for example. The pixel-defining film PDL may include a black coloring agent. The black coloring agent may include a black dye or a black pigment. The pixel-defining film PDL may be a light-blocking pattern having a light-blocking property.

FIGS. 4A and 4B illustrate embodiments in which the light-emitting layers EML-R, EML-B, and EML-G of the light-emitting elements ED-1, ED-2, and ED-3 are disposed within the pixel openings OH defined in the pixel-defining film PDL, and the hole transport region HTR, the electron transport region ETR, the second electrode EL2, and the capping layer CPL may be provided, as common layers, throughout the light-emitting elements ED-1, ED-2, and ED-3. However, the inventive concept is not limited thereto. Unlike the embodiment illustrated in FIGS. 4A and 4B, etc., in an embodiment, at least one of the hole transport region HTR, the electron transport region ETR, the second electrode EL2, or the capping layer CPL may be provided inside the pixel opening OH defined in the pixel-defining film PDL after being patterned.

In an embodiment, at least one of the hole transport region HTR, the light-emitting layers EML-R, EML-B, and EML- G, the electron transport region ETR, the second electrode EL2, or the capping layer CPL of the light-emitting elements ED-1, ED-2, and ED-3 may be provided after being patterned through an inkjet printing method.

In the light-emitting element ED, the first electrode EL1 may be disposed on the circuit layer DP-CL. The first electrode EL1 may be an anode or a cathode. In addition, the first electrode EL1 may be a pixel electrode. The first electrode EL1 may be a transmissive electrode, a transflective electrode, or a reflective electrode.

The hole transport region HTR may be disposed between the first electrode EL1 and the light-emitting layer EML. The hole transport region HTR may include at least one of a hole injection layer, a hole transport layer, or an electron blocking layer. The hole transport region HTR may be disposed as a common layer so as to overlap an entirety of the pixel regions PXA-R, PXA-G, and PXA-B and the pixel-defining films PDL that separates the pixel regions PXA-R, PXA-G, and PXA-B. However, the inventive concept is not limited thereto, and the hole transport region HTR may be provided after being patterned so as to be separately disposed corresponding to each of the pixel regions PXA-R, PXA-G, and PXA-B.

The light-emitting layer EML may be disposed on the first electrode EL1. The light-emitting layer EML may include a plurality of light-emitting layers EML-R, EML-B, and EML-G. The first light-emitting layer EML-R may overlap the first pixel region PXA-R and emit first light. The second light-emitting layer EML-G may overlap the second pixel region PXA-G and emit second light. The third light-emitting layer EML-B may overlap the third pixel region PXA-B and emit third light. In the light-emitting elements ED-1, ED-2, and ED-3 in an embodiment, the first to third light may substantially have different wavelength ranges, respectively. In an embodiment, the first light may be red light having a wavelength range of about 625 nanometers (nm) to about 675 nm, the second light may be green light having a wavelength range of about 500 nm to about 570 nm, and the third light may be blue light having a wavelength range of about 410 nm to about 480 nm, for example. In this specification, any light (first light, second light, or third light) emitted from the light-emitting layer EML may mean source light.

The electron transport region ETR may be disposed between the light-emitting layer EML and the second electrode EL2. The electron transport region ETR may include at least one of an electron injection layer, an electron transport layer, or a hole blocking layer. The electron transport region ETR may be disposed as a common layer so as to overlap an entirety of the pixel regions PXA-R, PXA-G, and PXA-B and the pixel-defining films PDL that separates the pixel regions PXA-R, PXA-G, and PXA-B. However, the inventive concept is not limited thereto, and the electron transport region ETR may be provided after being patterned so as to be separately disposed corresponding to each of the pixel regions PXA-R, PXA-G, and PXA-B.

The second electrode EL2 may be disposed on the electron transport region ETR. The second electrode EL2 may be a common electrode. The second electrode EL2 may be a cathode or an anode, but the inventive concept is not limited thereto. In an embodiment, when the first electrode EL1 is an anode, the second electrode EL2 may be a cathode, and when the first electrode EL1 is a cathode, the second electrode EL2 may be an anode, for example. The second electrode EL2 may be a transmissive electrode, a transflective electrode or a reflective electrode.

The capping layer CPL may be further disposed on the second electrode EL2. The capping layer CPL may have a multi- or a single-layered structure. In an embodiment, the capping layer CPL may be an organic layer or an inorganic layer. In an embodiment, when the capping layer CPL includes an inorganic material, the inorganic material may include an alkali metal compound, such as LiF, an alkaline earth metal compound, such as $MgF_2$, SiON, $SiN_x$, $SiO_y$, or the like, for example. In an embodiment, when the capping layer CPL includes an organic material, the organic material may include α-NPD, NPB, TPD, m-MTDATA, $Alq_3$, CuPc, N4,N4,N4',N4'-tetra(biphenyl-4-yl)biphenyl-4,4'-diamine ("TPD15"), 4,4',4"-Tris(carbazol-9-yl)-triphenylamine ("TCTA"), or the like, or include an epoxy resin or acrylate such as methacrylate, for example. However, the inventive concept is not limited thereto.

The capping layer CPL may have a refractive index of about 1.6 or more. Specifically, the capping layer CPL may have a refractive index of about 1.6 or more with respect to light having a wavelength range of about 550 nm to about 660 nm.

In the display module DM in an embodiment, the plurality of light-emitting elements ED-1, ED-2, and ED-3 may respectively emit light having different wavelength ranges. In an embodiment, in an embodiment, the display module DM may include the first light-emitting element ED-1 which emits red light, the second light-emitting element ED-2 which emits green light, and the third light-emitting element ED-3 which emits blue light, for example. That is, the red pixel region PXA-R, the green pixel region PXA-G, and the blue pixel region PXA-B of the display device in an embodiment may respectively correspond to the first light-emitting element ED-1, the second light-emitting element ED-2, and the third light-emitting element ED-3.

However, the inventive concept is not limited thereto. The first to third light-emitting elements ED-1, ED-2, and ED-3 may emit light having the same wavelength range, or at least one thereof may emit light having a different wavelength range. In an embodiment, all the first to third light-emitting elements ED-1, ED-2, and ED-3 may emit blue light, for example.

The encapsulation layer TFE may be disposed on the light-emitting element ED. The encapsulation layer TFE may be disposed while covering the light-emitting element ED. The encapsulation layer TFE may be disposed on the capping layer CPL and be disposed while filling a portion of the pixel opening OH.

FIGS. 4A and 4B illustrate that the encapsulation layer TFE has a single layer, but the encapsulation layer TFE may include at least one organic film or inorganic film. The encapsulation layer TFE may have a structure of a thin-film encapsulation layer including at least one organic film and at least one inorganic film. In an embodiment, the structure of the encapsulation layer TFE may be a structure in which an organic film and an inorganic film are repeatedly stacked in an alternative manner, or a structure in which an inorganic film, an organic film and an inorganic film are sequentially stacked, for example. The encapsulation layer TFE may function to protect the light-emitting element ED against moisture and/or oxygen, and to protect the light-emitting element ED against foreign substances such as dust particles.

In an embodiment, the inorganic film included in the encapsulation layer TFE may include a silicon nitride layer, a silicon oxynitride layer, a silicon oxide layer, a titanium oxide layer, an aluminum oxide layer, or the like, for example, but is not particularly limited thereto. The organic film included in the encapsulation layer TFE may include an acrylic organic film, but is not particularly limited thereto.

The display module DM, in an embodiment, illustrated in FIG. 4A, may include the color filter layer CFL as the optical layer OPL (refer to FIG. 3) disposed on the display panel DP. The color filter layer CFL may be a light control layer which selectively transmits light.

The color filter layer CFL may include a filter portion CF and division patterns BM in which division openings OH-BM are defined. The division openings OH-BM may be defined to respectively correspond to the pixel openings OH.

The filter portion CF may include a first filter portion CF-R which transmits first color light, a second filter portion CF-G which transmits second color light, and a third filter portion CF-B which transmits third color light. In an embodiment, the first filter portion CF-R may be a red filter, the second filter portion CF-G may be a green filter, and the third filter portion CF-B may be a blue filter, for example.

The first to third filter portions CF-R, CF-G, and CF-B may each include a polymer photosensitive resin and a pigment or dye. The first filter portion CF-R may include a red pigment or dye, the second filter portion CF-G may include a green pigment or dye, and the third filter portion CF-B may include a blue pigment or dye. However, the inventive concept is not limited thereto, and the third filter portion CF-B may not include a pigment or dye. In an embodiment, the third filter portion CF-B may include or consist of a transparent photosensitive resin and may be transparent. When the third filter portion CF-B includes or consists of a transparent photosensitive resin, light passing through the third filter portion CF-B is not limited to the third color light.

The color filter layer CFL may include the division patterns BM. The division patterns BM may be disposed corresponding to the light-blocking region NPXA. The division patterns BM may include or consist of an organic light-blocking material or an inorganic light-blocking material which includes a black pigment or a black dye. Also, the division patterns BM may each be formed as a blue filter.

Unlike the embodiment illustrated in FIG. 4A, in another embodiment, the color filter layer CFL does not include additional division patterns BM, and may include portions where a plurality of filter portions CF-R, CF-G, and CF-B is disposed to overlap each other in a third direction axis (also referred to as a third direction) DR3, which is the thickness direction, while corresponding to a light-blocking region NPXA. The portions where the plurality of filter portions CF-R, CF-G, and CF-B is disposed to overlap each other may be also referred to as division patterns.

The color filter layer CFL may further include an overcoat layer OC. The overcoat layer OC may cover the filter portions CF and the division patterns BM. The overcoat layer OC may overlap an entirety of the display element layer DP-ED. An upper surface of the overcoat layer OC may define an upper surface of the color filter layer CFL, cover a front surface of a display panel DP, and protect the display panel DP.

The color filter layer CFL may function as a light control layer which selectively transmits incident light. In an embodiment, the color filter layer CFL may be a relatively low reflective layer or an anti-reflective layer which reduces reflectance for external light incident from the outside of the display device. In addition, the color filter layer CFL selectively transmits portion of provided light, and thus the color gamut of the display device may be improved. In this specification, the term "a color gamut" may mean a range of a color which may be shown by a display device. In an embodiment, the color filter layer CFL selectively absorbs or transmits light having a predetermined wavelength range, and thus a color gamut may be improved, for example.

The light, which passes through the color filter layer CFL and enters the display panel DP, etc., may be non-polarized light. The display panel DP may receive non-polarized light from above the color filter layer CFL.

The display module DM may include a scattering layer SL disposed on the color filter layer CFL. The scattering layer SL may scatter at least portion of light emitted from the display panel DP or external light incident from the outside of the display device. Hereinafter, detailed components of the scattering layer SL will be described later.

A display device in an embodiment may include a color filter layer including filter portions, which selectively transmit light, and a scattering layer disposed above the color filter layer, thereby exhibiting an effect of reducing reflected light caused by external light.

In the display module DM in an embodiment, the sensor layer TU may be disposed between the display panel DP and the color filter layer CFL. The sensor layer TU may acquire, through an external input, information for generating an image on the display panel DP. The external input may be a user's input. The user's input may include various types of external inputs such as a part of a user's body, light, heat, a pen, or pressure.

The sensor layer TU may include a sensor base layer BS-TU, a first conductive layer SP1, an inorganic insulating layer IL, a second conductive layer SP2, and an organic insulating layer OL. The first conductive layer SP1 may be disposed on the sensor base layer BS-TU. The inorganic insulating layer IL may cover the first conductive layer SP1 and be disposed on the sensor base layer BS-TU and the first conductive layer SP1. The second conductive layer SP2 may be disposed on the inorganic insulating layer IL. The organic insulating layer OL may cover the second conductive layer SP2 and be disposed on the inorganic insulating layer IL and the second conductive layer SP2.

The sensor base layer BS-TU may be an inorganic layer including any one of silicon nitride, silicon oxynitride, or silicon oxide. In an alternative embodiment, the sensor base layer BS-TU may be an organic layer including an epoxy resin, an acrylic resin, or an imide-based resin. The sensor base layer BS-TU may have a single-layered structure or a multi-layered structure in which layers are stacked along the third direction DR3. The sensor base layer BS-TU may be directly disposed on the encapsulation layer TFE.

The first conductive layer SP1 and the second conductive layer SP2 may each have a single-layered structure or a multi-layered structure in which layers are stacked along the third direction DR3. The conductive layers SP1 and SP2 having a single-layered structure may include a metal layer or a transparent conductive layer. The metal layer may include molybdenum, silver, titanium, copper, aluminum, or any alloys thereof. The transparent conductive layer may include a transparent conductive oxide such as indium tin oxide ("ITO"), indium zinc oxide ("IZO"), zinc oxide (ZnO), and indium zinc tin oxide ("IZTO"). In addition, the transparent conductive layer may include a conductive polymer, such as poly(3,4-ethylenedioxythiophene) ("PEDOT"), a metal nanowire, graphene, or the like.

The conductive layers SP1 and SP2 having a multi-layered structure may include metal layers. In an embodiment, the metal layers may have a three-layered structure of titanium (Ti)/aluminum (Al)/titanium (Ti), for example. The conductive layers SP1 and SP2 having a multi-layered structure may include at least one metal layer and at least one transparent conductive layer.

The inorganic insulating layer IL may include at least one of aluminum oxide, titanium oxide, silicon oxide, silicon oxynitride, zirconium oxide, or hafnium oxide.

A contact hole CN may be defied in the inorganic insulating layer IL. The first conductive layer SP1 may be electrically connected to the second conductive layer SP2 via the contact hole CN. The contact hole CN may be filled with a material of the second conductive layer SP2.

The organic insulating layer OL may cover the inorganic insulating layer IL and the second conductive layer SP2. In an embodiment, the organic insulating layer OL may include at least one of an acylate-based resin, a methacrylate-based resin, a polyisoprene-based resin, a vinyl-based resin, an epoxy-based resin, a urethane-based resin, a cellulose-based resin, a siloxane-based resin, a polyimide-based resin, or a perylene-based resin, for example.

The display module DM-1, in an embodiment, illustrated in FIG. 4B differs from the display module DM illustrated in FIG. 4A in that compared to the display module DM, the display module DM-1 further includes an inorganic deposition layer INF in a display element layer DP-ED1, and includes a light control layer AR different from the color filter layer CFL above the display panel DP.

Referring to FIG. 4B, the display element layer DP-ED1 in an embodiment may include the inorganic deposition layer INF disposed on the light-emitting element ED. The inorganic deposition layer INF may be disposed on a capping layer CPL. The inorganic deposition layer INF may be directly disposed on the capping layer CPL. The inorganic deposition layer INF may be a layer for preventing external light from being reflected due to a second electrode EL2 of each of the light-emitting elements ED-1, ED-2, and ED-3. More specifically, it may be understood that destructive interference between light reflected on a surface of the inorganic deposition layer INF and light reflected on the second electrode EL2 occurs, and thus the reflected amount of external light on a surface of the second electrode EL2 may be reduced. The thicknesses of the inorganic deposition layer INF and the capping layer CPL may be adjusted so as to cause destructive interference between the light reflected on the surface of the inorganic deposition layer INF and the light reflected on the second electrode EL2 to occur.

The inorganic deposition layer INF may include an inorganic material having a refractive index of about 1.0 or more and a light absorption coefficient of about 0.5 or more. The inorganic deposition layer INF may be formed through a thermal evaporation process and include an inorganic material having a melting point of about 1000 degrees Celsius (C) or less. In an embodiment, the inorganic deposition layer INF may include at least one selected from the group including bismuth (Bi) and ytterbium (Yb), for example. A material, from which the inorganic deposition layer INF is formed, may consist of bismuth (Bi) or ytterbium (Yb), or may be a mixed deposition material of $Yb_xBi_y$. The encapsulation layer TFE may be directly disposed on at least a portion of the inorganic deposition layer INF.

In the display module DM-1 in an embodiment, the light control layer AR may be disposed on the display panel DP. The light control layer AR may mean the optical layer OPL illustrated in FIG. 3. The light control layer AR absorbs portion of light emitted from the display panel DP and transmits the other portion of the light, and thus a color gamut may be improved. In an embodiment, the light control layer AR selectively absorbs light within a predetermined wavelength range, and thus a color gamut may be improved, for example.

The light control layer AR may cover an entirety of the display element layer DP-ED1. The light control layer AR may cover an entirety of each of a first light-emitting element ED-1, a second light-emitting element ED-2, and a third light-emitting element ED-3. The light control layer AR may cover a front surface of the display panel DP and protect the display panel DP. The light, which passes through the light control layer AR and enters the display panel DP and the sensor layer TU, may be non-polarized light. The display panel DP and the sensor layer TU may receive non-polarized light from above the light control layer AR.

The light control layer AR may include division patterns BM and an overcoat layer OC-1. The overcoat layer OC-1 may include an organic material. The overcoat layer OC-1 may include a pigment or a dye. The division patterns BM may be disposed to overlap a light-blocking region NPXA. In addition, the division patterns BM may each include an organic light-blocking material, a black pigment, a black dye, or the like.

A display device including a display module, in an embodiment illustrated in FIG. 4B, may include an inorganic deposition layer, which induces destructive interference of light, a light control layer, which selectively transmits light, and a scattering layer disposed on the light control layer, thereby exhibiting an effect of reducing reflected light caused by external light.

Figure 5A:
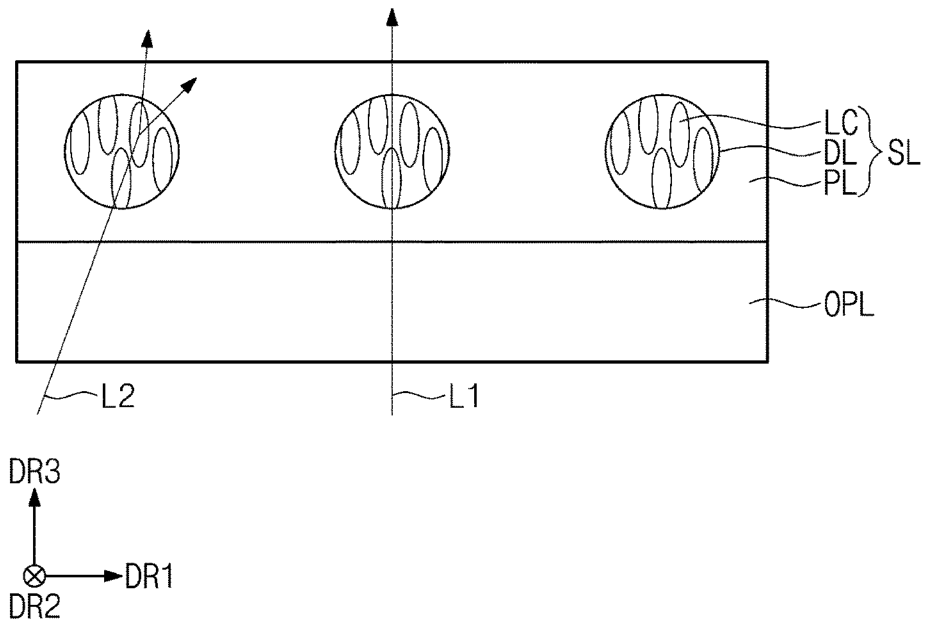
FIG. 5A is an enlarged cross-sectional view illustrating an embodiment of some components of a display module.
Figure 5B:
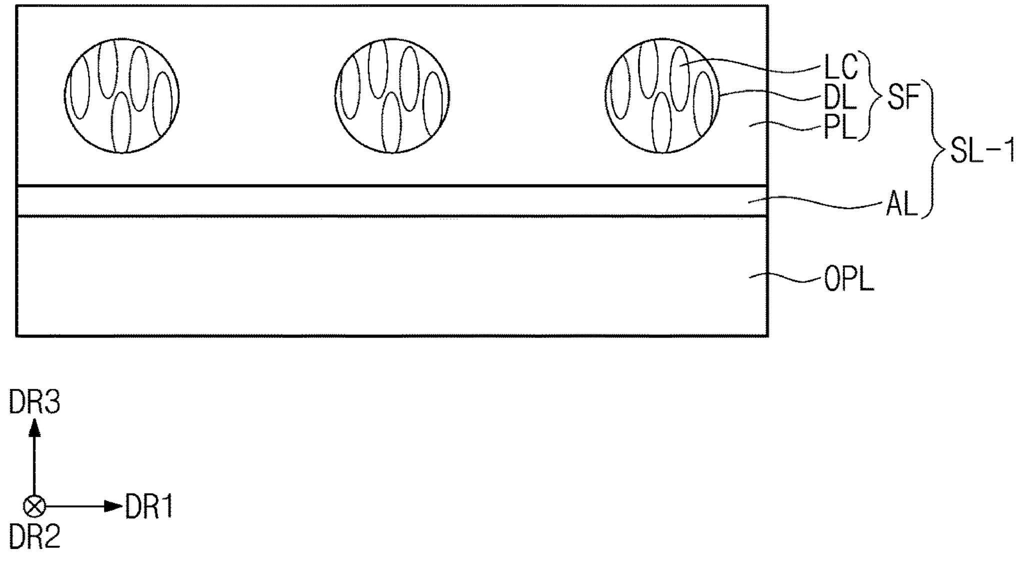
FIG. 5B is an enlarged cross-sectional view illustrating an embodiment of some components of a display module.

FIGS. 5A and 5B are respectively enlarged cross-sectional views illustrating some components of a display module according to other embodiments. FIG. 5A briefly illustrates a stacked structure of an optical layer OPL and a scattering layer SL, and FIG. 5B briefly illustrates a structure in which the optical layer OPL, an adhesive layer AL, and the scattering layer SL are sequentially stacked. Hereinafter, the scattering layer SL according to the inventive concept will be described in more detail with reference to FIGS. 5A and 5B.

Referring to FIG. 5A, the scattering layer SL in an embodiment may include a polymer resin PL and a plurality of droplets DL dispersed in the polymer resin PL. The scattering layer SL may include polymer dispersed liquid crystals ("PDLCs"). FIGS. 4A and 4B arbitrarily illustrate the number of the droplets DL in the scattering layer SL, and FIG. 5A arbitrarily illustrates three enlarged droplets DL in the scattering layer SL. However, the number of the droplets DL in the scattering layer SL is not limited thereto, and the number of the droplets DL in the scattering layer SL or an arrangement of the droplets DL may be variously designed according to a light scattering degree, a wavelength range, or the like.

The polymer resin PL may provide a base material in which the plurality of droplets DL is dispersed. The polymer resin PL may include a transparent material. The polymer resin PL may consist of an isotropic material. The polymer resin PL may include an epoxy-based resin or an acylate-based resin. However, a material of the polymer resin PL is not limited thereto, and the polymer resin PL may include, when desired, a polymer material capable of dispersing the plurality of droplets DL.

The plurality of droplets DL may each have liquid crystal molecules LC dispersed in the polymer resin PL in a droplet form. The droplets DL may include the liquid crystal molecules LC dispersed in the polymer resin PL and a reactive mesogen which fixes the liquid crystal molecules LC. The droplets DL may have a polymer network formed on the basis of a reactive mesogen. FIG. 5A illustrates the droplets DL having a spherical shape, but the inventive concept is not limited thereto. The droplets DL may have various shapes when desired, and the plurality of droplets DL may respectively have different shapes.

The reactive mesogen may be coupled to the liquid crystal molecules LC and fix alignment directions of the liquid crystal molecules LC. The liquid crystal molecules LC may be provided in plural, and the plurality of liquid crystal molecules LC may each be fixed in the same alignment direction. When the display device in an embodiment is manufactured, the plurality of liquid crystal molecules LC may be simultaneously aligned through the same electric field to be aligned in the same direction.

The reactive mesogen may be a polymerizable monomeric compound including a mesogen group. The mesogen group may be a group of acrylate, methacrylate, epoxy, oxetane, vinyl-ether, styrene, or thiorene, but is not limited thereto.

Since the scattering layer SL in an embodiment includes anisotropic liquid crystal molecules LC, at least portion of light incident onto the scattering layer SL may be scattered. Among the light incident onto the scattering layer SL, vertical light L1 may be directly emitted. Among the light incident onto the scattering layer SL, oblique light L2 may be scattered. In this specification, the vertical light L1 may mean light in a direction where the refractive index of the liquid crystal molecules LC is the same as the refractive index of the polymer resin PL, and the oblique light L2 may mean light in a direction where the refractive index of the liquid crystal molecules LC is different from the refractive index of the polymer resin PL.

The scattering layer SL in an embodiment may scatter at least portion of source light generated from the light-emitting element ED (refer to FIG. 4A). Accordingly, a viewing angle of a user using the display device in an embodiment may be relatively widened. It is possible to relatively reduce a value of a white angle difference ("WAD") that occurs because the amount of source light provided varies according to a predetermined viewing angle and/or a predetermined azimuth angle. The scattering layer SL in an embodiment may scatter at least portion of reflected light caused when light provided from the outside of the display device is incident onto the display panel DP (refer to FIG. 4A) and re-emitted. In an alternative embodiment, the scattering layer SL in an embodiment may scatter at least a portion of a diffraction pattern or interference light occurring due to a step, etc., of the optical layer OPL. Therefore, reflected light caused by external light is reduced, and thus the display device may exhibit excellent display quality.

The transmittance of the scattering layer SL with respect to light may be about 50% to about 100%. In an embodiment, the transmittance of the scattering layer SL with respect to visible light may be about 80% to about 100%, for example. The scattering layer SL may have a haze of about 1% to about 50%. In an embodiment, the scattering layer SL may have a haze value of about 10% or less, for example. The scattering layer SL in an embodiment has a relatively high transmittance and a relatively low haze, and thus the display quality of the display device may be improved.

The scattering layer SL may further include a light-absorbing material. In an embodiment, the scattering layer SL may include a material absorbing ultraviolet light having a wavelength range of about 100 nm to about 400 nm, or a material absorbing infrared light having a wavelength range of about 750 nm to about 1500 nm, for example.

The scattering layer SL may have a thickness of about 1 micrometer (μm) to about 100 μm. When the scattering layer SL in an embodiment is manufactured, the scattering layer SL formed through a coating process may have a thickness of about 1 μm to about 10 μm. Therefore, a folding operation of the display device is facilitated, and thus the excellent folding reliability may be achieved.

Referring to FIG. 5B, a scattering layer SL-1 in another embodiment may include a scattering film SF and an adhesive layer AL disposed between the scattering film SF and an optical layer OPL. The scattering film SF may include a polymer resin PL and a plurality of droplets DL. The scattering layer SL-1 may be provided in a film form and may be disposed on the optical layer OPL via the adhesive layer AL. However, a stacked structure of the scattering layer SL-1 is not limited thereto, and any structure in which the polymer resin PL and the plurality of droplets DL may be included may be provided variously.

The scattering film SF may have a thickness of about 10 μm to about 75 μm. In an embodiment, the scattering film SF may have a thickness of about 10 μm to about 50 μm, for example. The scattering layer SL-1 including the scattering film SF may have a thickness of about 100 μm or less. Therefore, a folding operation of the display device is facilitated, and thus the excellent folding reliability may be achieved.

The adhesive layer AL may include a pressure sensitive adhesive film ("PSA") or an optically clear adhesive ("OCA"). In an embodiment, the adhesive layer AL in an embodiment may include a pressure sensitive adhesive, for example.

Hereinafter, a method of manufacturing a display device in an embodiment of the inventive concept will be described with reference to FIGS. 6A, 6B, 7A, 7B and FIGS. 8A to 8C. In the description of the method of manufacturing the display device in an embodiment of the inventive concept, the same reference numerals or symbols are used for the components duplicated with those described above, and a detailed description thereof will be omitted.

Figure 6A:
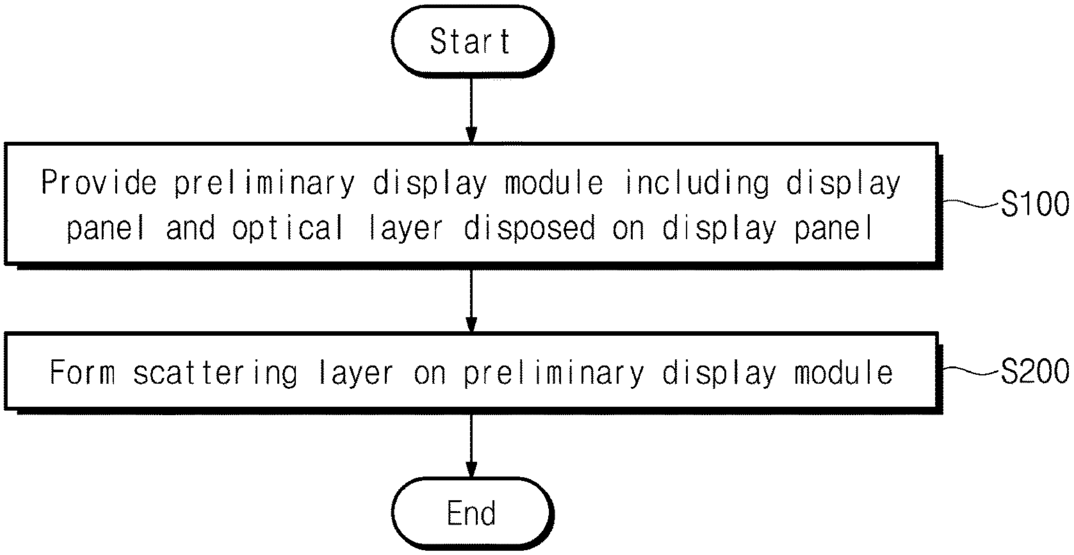
FIG. 6A is a flowchart illustrating an embodiment of some operations of a method of manufacturing a display device.
Figure 6B:
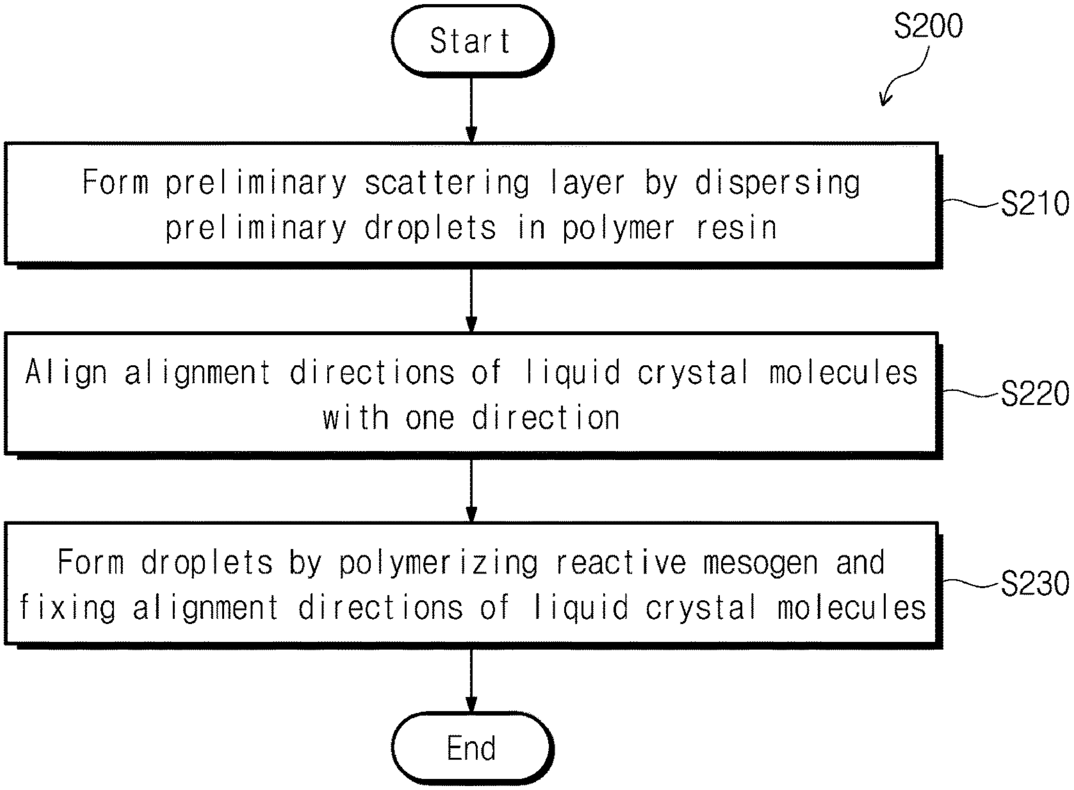
FIG. 6B is a flowchart illustrating an embodiment of an operation of forming a scattering layer in a method of manufacturing a display device.

FIG. 6A is a flowchart illustrating an embodiment of some operations of a method of manufacturing a display device. FIG. 6B is a flowchart illustrating an embodiment of operations of forming a scattering layer in a method of manufacturing a display device.

Referring to FIG. 6A, the method of manufacturing the display device in an embodiment includes providing a preliminary display module including a display panel and an optical layer disposed on the display panel (S100), and forming a scattering layer on the preliminary display module (S200). Referring to FIG. 6B, the operation of forming the scattering layer on the preliminary display module (S200) may include forming a preliminary scattering layer by dispersing preliminary droplets in a polymer resin (S210), aligning alignment directions of liquid crystal molecules with one direction (S220), and forming droplets by polymerizing a reactive mesogen and fixing the alignment directions of the liquid crystal molecules (S230).

Figure 7A:
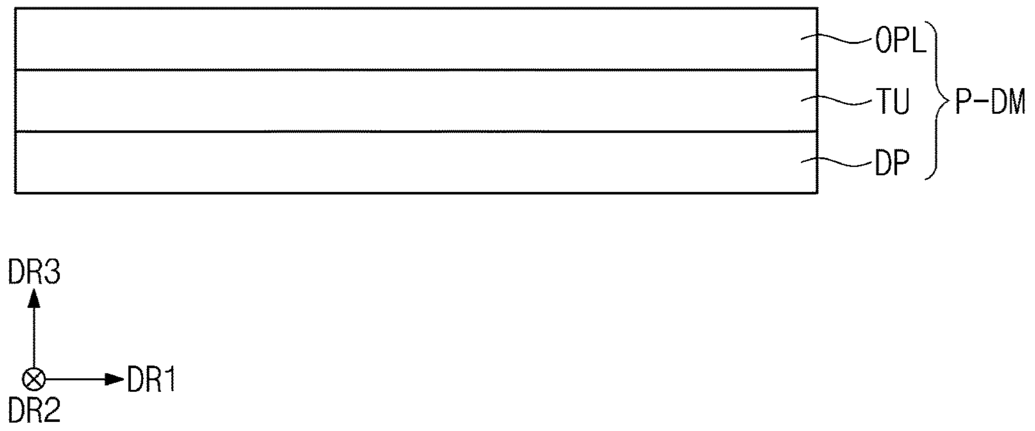
FIGS. 7A and 7B are cross-sectional views sequentially illustrating an embodiment of some operations in a method of manufacturing a display device.
Figure 7B:
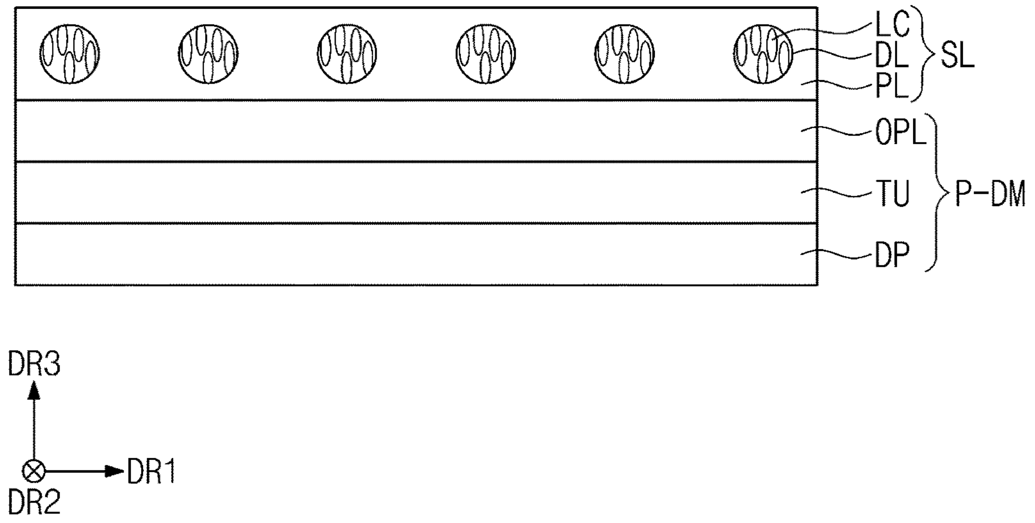
Figure 8A:
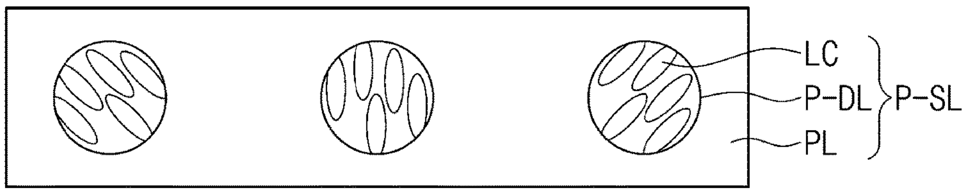
FIGS. 8A to 8C are cross-sectional views sequentially illustrating an embodiment of operations of forming a scattering layer in a method of manufacturing a display device.
Figure 8B:
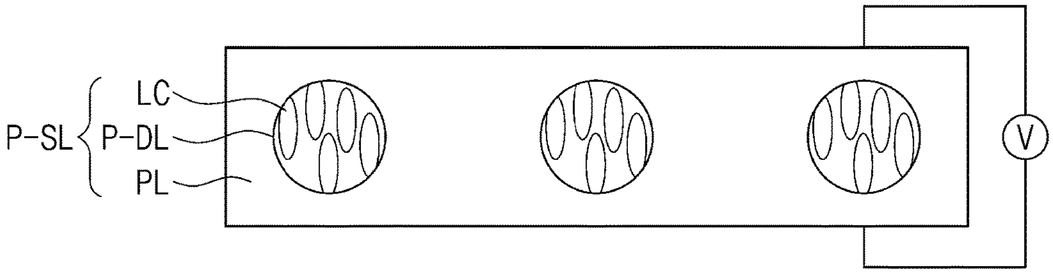
Figure 8C:
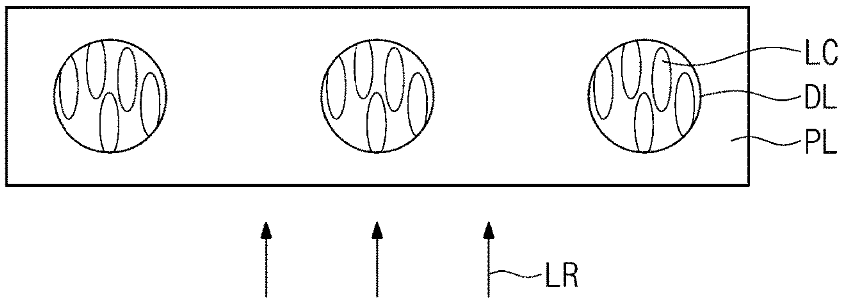

FIGS. 7A and 7B are cross-sectional views sequentially illustrating an embodiment of some operations in a method of manufacturing a display device according to the inventive concept. FIGS. 8A to 8C are cross-sectional views sequentially illustrating an embodiment of operations of forming a scattering layer in a method of manufacturing a display device according to the inventive concept.

Referring to FIG. 7A, the method of manufacturing the display device in an embodiment may include providing a preliminary display module P-DM. The preliminary display module P-DM may include a display panel DP, a sensor layer TU disposed on the display panel DP, and an optical layer OPL disposed on the sensor layer TU.

Referring to FIG. 7B, the method of manufacturing the display device in an embodiment may include forming a scattering layer SL on the preliminary display module P-DM. The scattering layer SL may include a polymer resin PL and a plurality of droplets DL dispersed in the polymer resin PL.

Referring to FIG. 8A, the operation of forming the scattering layer SL in an embodiment of the inventive concept may include forming a preliminary scattering layer P-SL by dispersing, in a polymer resin PL, preliminary droplets P-DL including liquid crystal molecules LC. The liquid crystal molecules LC of the preliminary droplets P-DL may have disordered alignment directions unlike liquid crystal molecules LC of droplets DL which will be described later with reference to FIGS. 8B and 8C. That is, the liquid crystal molecules LC of the preliminary droplets P-DL may not be aligned with one direction.

The operation of forming the preliminary scattering layer P-SL may substantially mean an operation of dispersing the liquid crystal molecules LC in the polymer resin PL. The operation of forming the preliminary scattering layer P-SL may include dispersing the liquid crystal molecules LC in the polymer resin PL through a phase separation method. Specifically, the operation of forming the preliminary scattering layer P-SL may include mixing the liquid crystal molecules LC and a pre-polymer of the polymer resin PL, and then curing and polymerizing the resultant combination. In this case, the liquid crystal molecules LC and the polymer resin PL may be phase-separated. Alternately, the operation of forming the preliminary scattering layer P-SL may include dispersing the liquid crystal molecules LC in the polymer resin PL through an emulsification method. Specifically, the operation of forming the preliminary scattering layer P-SL may include dispersing the liquid crystal molecules LC in the polymer resin PL by forming an emulsion of the liquid crystal molecules through a colloidal dispersion system or the like.

Referring to FIG. 8B, the operation of forming the scattering layer SL in an embodiment of the inventive concept may include aligning alignment directions of the liquid crystal molecules LC of the preliminary droplets P-DL with one direction. The operation of aligning the alignment directions of the liquid crystal molecules LC with one direction may include applying a voltage of a predetermined level or more to the preliminary scattering layer P-SL. Since a voltage of a predetermined level or more is applied to the preliminary scattering layer P-SL, the refractive index of the liquid crystal molecules LC may be similar to the refractive index of the polymer resin PL. Therefore, vertical light with respect to the liquid crystal molecules LC may not be reflected.

Referring to FIGS. 8B and 8C, the operation of forming the scattering layer SL in an embodiment of the inventive concept may include forming the droplets DL by fixing the alignment directions of the liquid crystal molecules LC.

The operation of forming the droplets DL may include forming a polymer network obtained through polymerization reaction of the reactive mesogen. Specifically, the operation of forming the droplets DL may include irradiating the preliminary scattering layer P-SL with light LR. In this case, as the reactive mesogen is photopolymerized, the alignment directions of the droplets DL may be fixed to one direction. In the operation of irradiating the preliminary scattering layer P-SL with the light LR, the light LR may be ultraviolet rays.

A display device in an embodiment may include a scattering layer including liquid crystal molecules, thereby exhibiting a relatively low external light reflectance and also an improved reliability characteristic.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

Therefore, the technical scope of the inventive concept is not limited to the contents described in the detailed description of the specification, but should be determined by the claims.

What is claimed is:

1. A display device comprising:

a display panel including a pixel-defining film in which a plurality of pixel openings is defined, and a light-emitting layer disposed in each of the plurality of pixel openings;

an optical layer disposed on the display panel and including at least one of a dye or a pigment; and a scattering layer disposed on the optical layer, the scattering layer including:

a polymer resin; and a plurality of droplets dispersed in the polymer resin, the plurality of droplets each including:

a plurality of liquid crystal molecules; and a reactive mesogen which fixes the plurality of liquid crystal molecules.

2. The display device of claim 1, wherein alignment directions of the plurality of liquid crystal molecules are fixed to the same direction.

3. The display device of claim 1, wherein light incident onto the optical layer is non-polarized light.

4. The display device of claim 1, wherein a transmittance of the scattering layer with respect to visible light is about 50% to about 100%, and the scattering layer has a haze of about 1% to about 50%.

5. The display device of claim 1, wherein the scattering layer has a thickness of about 1 micrometer to about 100 micrometers.

6. The display device of claim 1, wherein the scattering layer further comprises an ultraviolet absorbing material or an infrared absorbing material.

7. The display device of claim 1, wherein the scattering layer comprises:

an adhesive layer disposed on the optical layer; and a scattering film disposed on the adhesive layer, wherein the scattering film comprises the polymer resin and the plurality of droplets.

8. The display device of claim 7, wherein the adhesive layer comprises a pressure sensitive adhesive ("PSA").

9. The display device of claim 1, wherein the optical layer comprises a color filter layer including division patterns in which division openings are defined respectively corresponding to the plurality of pixel openings, and a filter portion which overlaps each of the division openings.

10. The display device of claim 9, wherein the optical layer further comprises an overcoat layer disposed on the color filter layer.

11. The display device of claim 1, wherein the display panel further comprises an inorganic deposition layer disposed on the light-emitting layer, and the optical layer comprises a light control layer including the pigment or the dye.

12. The display device of claim 1, wherein the light-emitting layer does not comprise liquid crystal molecules.

13. The display device of claim 1, comprising:

a folding region; and a first non-folding region and a second non-folding region which are spaced apart from each other with the folding region therebetween in a first direction.

14. The display device of claim 1, further comprising a window disposed on the scattering layer.

15. A display device comprising:

a display panel including a pixel-defining film in which a plurality of pixel openings is defined, and a light-emitting layer disposed in each of the plurality of pixel openings;

a color filter layer including division patterns, which are disposed on the display panel and in which division openings are defined respectively corresponding to the plurality of pixel openings, and a filter portion which overlaps each of the division openings; and a scattering layer disposed on the color filter layer, the scattering layer including:

a polymer resin and liquid crystal molecules which are dispersed in the polymer resin and of which alignment directions are fixed to a predetermined direction.

* * * * *